(12) United States Patent
Berger et al.

(10) Patent No.: US 7,745,820 B2
(45) Date of Patent: Jun. 29, 2010

(54) NEGATIVE DIFFERENTIAL RESISTANCE POLYMER DEVICES AND CIRCUITS INCORPORATING SAME

(75) Inventors: Paul R. Berger, Columbus, OH (US); Woo-Jun Yoon, Columbus, OH (US)

(73) Assignee: The Ohio State University, Columbus, OH (US)

(*) Notice: Subject to any disclaimer, the term of this patent is extended or adjusted under 35 U.S.C. 154(b) by 695 days.

(21) Appl. No.: 11/592,419

(22) Filed: Nov. 3, 2006

(65) Prior Publication Data

US 2010/0084627 A1 Apr. 8, 2010

Related U.S. Application Data

(60) Provisional application No. 60/733,273, filed on Nov. 3, 2005.

(51) Int. Cl.
*H01L 35/24* (2006.01)
(52) U.S. Cl. .................. 257/40; 257/245; 257/249; 257/E27.1
(58) Field of Classification Search .................. 257/40, 257/245, 249, E27.1; 438/99
See application file for complete search history.

(56) References Cited

U.S. PATENT DOCUMENTS

| | | | |
|---|---|---|---|
| 2001/0055838 A1* | 12/2001 | Walker et al. | 438/129 |
| 2003/0086214 A1* | 5/2003 | Shin | 360/266.3 |
| 2005/0270442 A1* | 12/2005 | Yang et al. | 349/86 |
| 2006/0160307 A1* | 7/2006 | Joo et al. | 438/261 |

OTHER PUBLICATIONS

Yoon et al., "Room-temperature negative differential resistance in polymer tunnel diodes . . . ," Applied Physics Letters 87, 203506, 3 pages, 2005.
Sudirgo et al., "Monolithically integrated Si/SiGe resonant interband tunnel . . . ," Solid-State Electronics 48, pp. 1907-1910, 2004.
Xu et al., "Photoresponsivity of polymer thin-film transistors based on . . . ," Applied Physics Letters, vol. 85, No. 18, pp. 4219-4221, 2004.
Xu et al., "High electric-field effects on short-channel polythiophene polymer . . . ," Journal of Applied Physics, vol. 95, No. 3, pp. 1497-1501, 2004.
Borekaert et al., "A Monolithic 4-Bit 2-Gsps Resonant Tunneling . . . ," IEEE Journal of Solid-State Circuits, vol. 33, No. 9, pp. 1342-1349, 1998.

(Continued)

*Primary Examiner*—Wai-Sing Louie
(74) *Attorney, Agent, or Firm*—Fay Sharpe LLP

(57) ABSTRACT

A device includes: a first electrical contact; a second electrical contact; a semiconducting or semimetallic organic layer disposed at least partially between the first and second electrical contacts; and a tunneling barrier layer disposed at least partially between the semiconducting or semimetallic organic layer and the first electrical contact. The tunneling barrier layer has a thickness effective to enable flow of an electrical current through the tunneling barrier layer responsive to an operative electrical bias applied across the first and second electrical contacts, the electrical current exhibiting negative differential resistance for at least some applied electrical bias values. Circuits are also disclosed that utilize one or more negative differential resistance polymer diodes to implement logic, memory, or mixed signal applications.

25 Claims, 12 Drawing Sheets

OTHER PUBLICATIONS

Cidronali et al., "Ultralow DC Power VCO Based on InP-HEMT and Heterojunction Interband . . . ," IEEE Transactions on Microwave Theory and Techniques, vol. 50, No. 12, pp. 2938-2946, 2002.

Van Der Wagt, "Tunneling-Based SRAM," Proceedings of the IEEE, vol. 87, No. 4, pp. 571-595, 1999.

Maezawa et al., "Functions and Applications of Monostable-Bistable Transition Logic Elements . . . ," IEEE Transactions on Electron Devices, vol. 31, No. 2, pp. 148-154, 1994.

Chen et al., "Large On-Off Ratios and Negative Differential Resistance . . . ," Science Magazine, vol. 286, pp. 1550-1552, 1999.

Collier et al., "Electronically Configurable Molecular-Based Logic Gates," Science Magazine, vol. 285, pp. 391-394, 1999.

Reed et al., "Molecular random access memory cell," Applied Physics Letters, vol. 78, No. 23, pp. 3735-3737, 2001.

Wang et al., "Room-temperature negative differential resistance in nanoscale molecular junctions," Applied Physics Letters, vol. 77, No. 8, pp. 1224-1226, 2000.

Le et al., "Negative differential resistance in a bilayer molecular junction," Applied Physics Letters, vol. 83, No. 26, pp. 5518-5520, 2003.

Khondaker et al., "Electron transport through single phenylene-ethnylene molecular . . . ," Applied Physics Letters, vol. 85, No. 4, pp. 645-647, 2004.

Burroughes et al., "Light-emitting diodes based on conjugated polymers," Nature Publishing Group, Vo.. 347, vol. 347, pp. 539-541, 1990.

Broms et al., "Calcium electrodes in polymer LEDs," Synethic Metals 74, pp. 179-181, 1995.

Cimrova et al., "Anomalous electrical characteristics, memory phenomena and microcavity . . . ," Synthetic Metals 76, pp. 125-128, 1996.

Pal et al., "Quinquethiophene light-emitting diodes with molecular dimensions," Physical Review B, vol. 55, No. 3,. 1306-1309, 1997.

Manca et al., "Effect of oxygen on the electrical characteristics of PPV-LEDs," Optical Materials 9, pp. 134-137, 1998.

Berleb et al., "Anomalous current-voltage characteristics in organic ligh-emitting devices," Synethic Metals 102, pp. 1034-1037, 1999.

Xu et al., "Organic Negative-Resistance Devices Using PPV Containing . . . ," Journal of Polymer Science: Part B, vol. 39, pp. 589-593, 2001.

Yu et al., "Anomalous current-voltage characteristics of polymer light-emitting diodes," Physical Review B, vol. 65, pp. 115211(1-5), 2002.

Moller et al., "A polymer/semiconductor write-once read-many-times memory," Nature, vol. 426, pp. 166-169, 2003.

Ouyang et al., "Programmable polymer thin film and non-volatile memory device," Naure Materials, vol. 3, pp. 918-922, 2004.

Tang et al., "Memory Effect and Negative Differential Resistance by . . . ," Advanced Materials 17, pp. 2307-2311, 2005.

Auer et al., "Low-Voltage MOBILE Logic Module Based on Si/SiGe Interband . . . ," IEEE Electron Device Letters, vol. 22, No. 5, pp. 215-217, 2001.

Tinoco et al., "Room temperature plasma oxidation mechanism to obtain ultrathin . . . ," Microelectronics Reliability 43, pp. 895-903, 2003.

Kolesnikov et al., "Anomalous current-voltage characteristics of thin polymer films," Phys. Stat Sol. (a) 200, No. 2, pp. 388-392, 2003.

Lyo et al., "Negative Differential Resistance on the Atomic Scale: Implications . . . ," Science, New Series, vol. 245, No. 4924, pp. 1369-1371, 1989.

Eppler et al., "Charge transport in porous nanoacrystalline titanium dioxide," Physica E. 14, pp. 197-202, 2002.

Burns et al., "The plasma oxidation of titanium thin films to form dielectric layers," J. Appl. Phys. 66 (6), pp. 2320-2324, 1989.

* cited by examiner

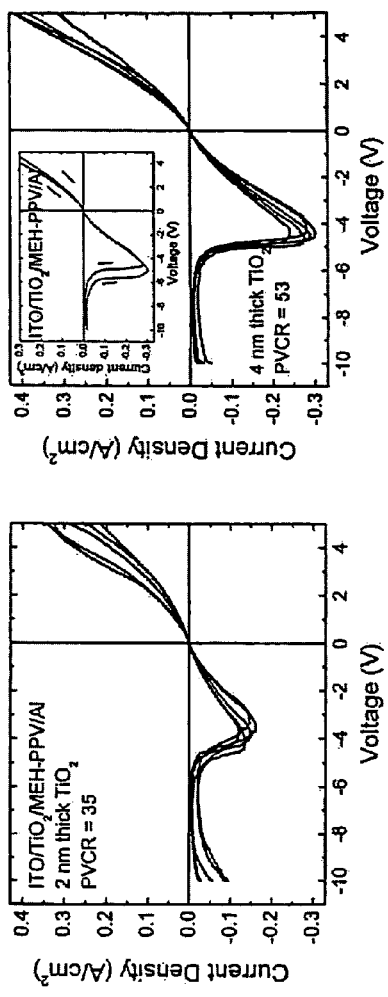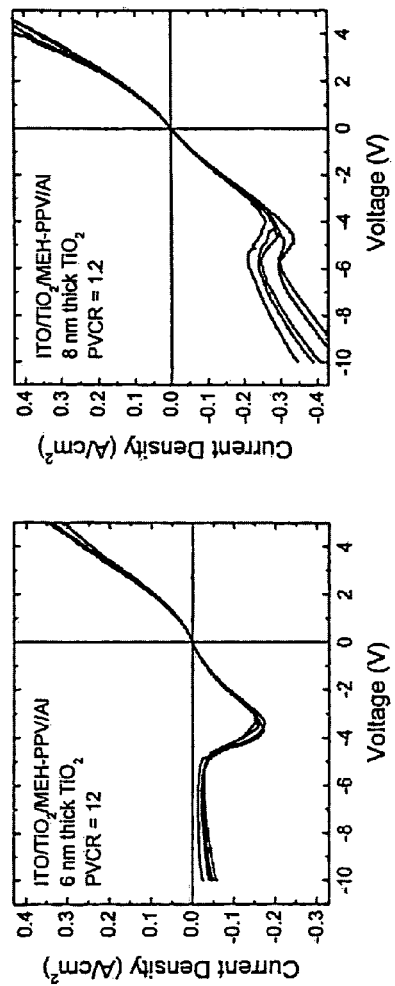
Fig. 3A Fig. 3B Fig. 3C Fig. 3D

_US 7,745,820 B2_

NEGATIVE DIFFERENTIAL RESISTANCE POLYMER DEVICES AND CIRCUITS INCORPORATING SAME

This application claims the benefit of U.S. Provisional Application No. 60/733,273 filed Nov. 3; 2005. U.S. Provisional Application No. 60/733,273 is incorporated by reference herein in its entirety.

This invention was made with Government support under grant no. DMR-0103248 awarded by the National Science Foundation. The Government has certain rights in this invention.

BACKGROUND

Negative differential resistance (NDR) devices have tremendous potential for low-power memory, logic, and mixed circuit applications. However, typical successful demonstrations of room temperature NDR suitable for circuit applications has involved rigid inorganic semiconductors, such as devices comprising silicon and silicon-germanium alloys, III-V compound semiconductors, or so forth. These rigid inorganic semiconductors are not conducive to incorporation in flexible memory devices such as Smartcard technology for portable storage of banking and medical information.

Advantageously, the N-shaped electrical characteristics of two serially connected NDR devices can be exploited to form a latch or memory device having two stable latching points. When this pair is fashioned into a one transistor tunneling diode static random access memory (1T TSRAM) cell utilizing NDR devices with extremely low valley current densities, the number of devices needed and the standby power consumption are greatly decreased from traditional six transistor SRAM memory. More generally, one or more NDR devices can be operatively coupled with at least one additional electrical element (typically a transistor, resistor, or the like defining a load) to define a latching or memory element having two or more stable states. For room temperature latching or memory operation, the NDR device should exhibit room temperature NDR operation with a reasonably high peak-to-valley current ratio (PVCR), such as PVCR values of about 2-3 or higher. Similarly, mixed-signal receiver circuits can be constructed using an NDR device to perform an analog-to-digital conversion by latching to various states. An RF oscillator source can also be fashioned by biasing in the NDR region to oscillate in this unstable region. With suitable circuitry, a compact voltage controlled oscillator can be constructed so that the RF output can be tuned.

NDR has been observed in molecular devices using molecules as the active material. However, these devices typically exhibit limited yield and repeatability. Moreover, the current-voltage shape for such molecular devices is typically not well-suited for providing robust latching behavior for latching or memory devices.

BRIEF SUMMARY

According to one aspect, a device is disclosed, comprising: a first electrical contact; a second electrical contact; a semiconducting or semimetallic organic layer disposed at least partially between the first and second electrical contacts; and a tunneling barrier layer disposed at least partially between the semiconducting or semimetallic organic layer and the first electrical contact. The tunneling barrier layer has a thickness effective to enable flow of an electrical current through the tunneling barrier layer responsive to an operative electrical bias applied across the first and second electrical contacts, the electrical current exhibiting negative differential resistance for at least some applied electrical bias values.

According to another aspect, a device is disclosed, comprising: a semiconducting or semimetallic organic layer; and a tunneling barrier layer disposed on and in electrical communication with the semiconducting or semimetallic organic layer to enable flow of an electrical current through the tunneling barrier layer responsive to an applied operative electrical bias, the electrical current exhibiting negative differential resistance for at least some applied operative electrical bias values, the tunneling barrier layer comprising a material selected from a group consisting of: a metal oxide, a Langmuir-Blodgett film, a self assembled monolayer (SAM), and a wide bandgap semiconductor.

According to another aspect, a device is disclosed. A semiconducting or semimetallic organic layer comprises a material selected from a group consisting of: a cyano-polyphenylene vinylene (CN-PPV), a polyphenylene vinylene (PPV), a PPV copolymer, a polyfluorene (PFO, PFE), a polythiophene, a ladder-type polymer, a co-polymer, a poly(aryleneethynylene), a semiconducting small molecule, a light emitting metal complex, and any fully or partially conjugated polymer. A tunneling barrier layer is disposed on and in electrical communication with the semiconducting or semimetallic organic layer to enable flow of an electrical current through the tunneling barrier layer responsive to an applied operative electrical bias, the electrical current exhibiting negative differential resistance for at least some applied operative electrical bias values.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention.

FIGS. 3A, 3B, 3C, and 3D plot measured current-voltage (I-V) characteristics for devices having the structure of FIG. 1 with the nominal structure ITO/TiO$_2$/MEH-PPV/Al but with different nominal thicknesses ($d_t$) for the TiO$_2$ tunneling barrier layer. FIGS. 3A, 3B, 3C, and 3D plot I-V characteristics for devices having $d_t$=2 nm, $d_t$=4 nm, $d_t$=6 nm, and $d_t$=8 nm, respectively.

DETAILED DESCRIPTION OF PREFERRED EMBODIMENTS

Figure 1:
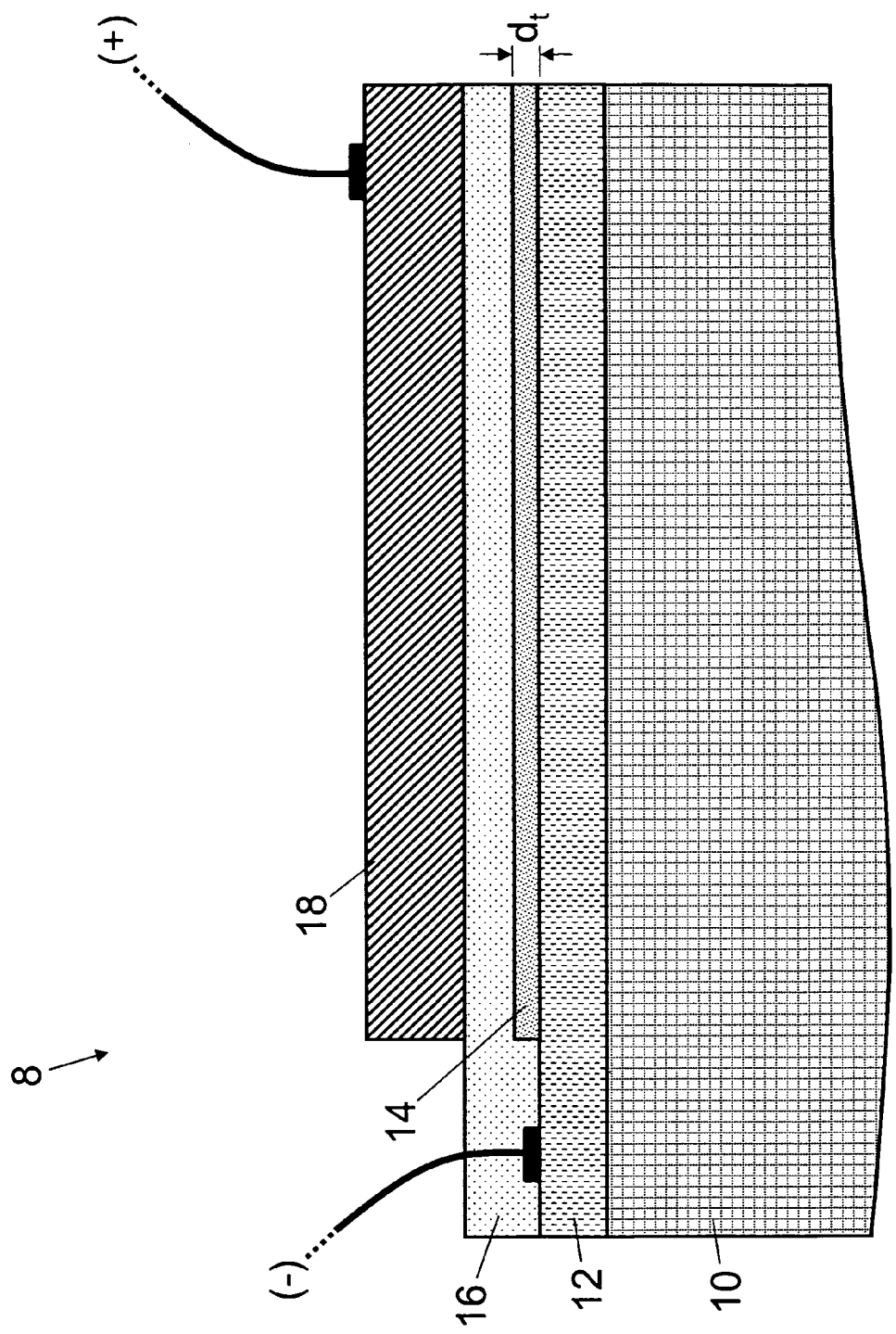
FIG. 1 shows a side sectional view of an example negative differential resistance polymer device. The layer thicknesses of the device of FIG. 1 are not drawn to scale or proportion.

With reference to FIG. 1, an example negative differential resistance (NDR) polymer device 8 is described. The negative differential resistance (NDR) polymer device 8 is formed on a suitable support 10, such as a glass, plastic, silicon, or other support. A first electrical contact 12 is disposed on the support 10. In FIG. 1, the support 10 is shown in part, as indicated by the curved "cutoff" at the bottom of the support 10. In some embodiments, the support 10 is generally planar. In some embodiments, the support 10 is a flexible support, such as are used in Smartcard devices and the like. In some embodiments, the first electrical contact 12 is an indium tin oxide (ITO) electrical contact layer. It is contemplated for the first electrical contact 12 and the support 10 to be a single unitary component, such as a copper film, that provides both support and serves as a first electrical contact 12. In such a case, the unitary component is defined herein as the first electrical contact 12.

A tunneling barrier layer 14 is disposed on the first electrical contact 12. In some embodiments, the tunneling barrier layer is an oxidized titanium layer formed by disposing titanium on the first electrical contact 12 and then oxidizing. It is also contemplated to dispose the metal oxide directly, for example by D.C. or rf sputtering, reactive sputtering, chemical vapor deposition, atomic layer deposition, molecular beam epitaxy, or so forth. While the tunneling barrier material of the tunneling barrier layer 14 is generally preferred to be comprised of an oxide of titanium such as $TiO_2$, it is generally understood that the barrier may also be comprised of a wide range of other suitable materials selected from the group consisting of: silicon-oxide; aluminum-oxide; a variety of other metal-oxides such as zinc oxide (ZnO), nickel oxide (NiO), silicon dioxide ($SiO_2$), or so forth; wide bandgap semiconductors such as silicon carbide, gallium nitride or other group III-nitride semiconductors or alloys thereof, or so forth; polyimides; photoresist; a Langmuir-Blodgett film such as Arachidic acid, poly-(p-(3-hexypyridylene)) (HPPy), polystyrene, poly(methylmethacrylate) (PMMA), or polyethylene oxide (PFO); polysiloxane resists, such as hydrogen silsesquioxane, or other suitable organic-based insulating layers; spin-on glassy materials, or composites of the above listed material. Other contemplated materials for the tunneling barrier layer 14 include a self assembled monolayer (SAM) such as 4-nitrophenylhiol (NPT) or poly(allyammonium). Further, it is envisioned that many of these host materials could also be seeded with suitable dopants, or even defects, to create an appropriate energy level within the tunneling barrier. The tunneling barrier layer 14 has a thickness $d_t$ as indicated in FIG. 1. This thickness is advantageously less than thirty nanometers to promote electrical current through the tunneling barrier layer 14, and is more preferably less than ten nanometers.

A semiconducting or semimetallic organic layer 16 is disposed over the tunneling barrier layer 14. In some embodiments, the semiconducting or semimetallic organic layer 16 is a poly[2-methoxy-5-(2'-ethyl-hexyloxy)-1,4-phenylenevinylene(MEH-PPV). While the organic material is generally preferred to be comprised of MEH-PPV, it is generally understood that the organic layer may also be comprised of a wide range of other suitable organics with semiconducting or semimetallic properties including, but not restricted to one or more individual organic materials, suitably polymers, preferably fully or partially conjugated polymers. Suitable materials for the semiconducting or semimetallic organic layer 16 include one or more of the following in any combination: poly(p-phenylenevinylene) (PPV), one or more PPV-derivatives (e.g. di-alkoxy or di-alkyl derivatives), polyfluorenes and/or co-polymers incorporating polyfluorene segments, PPVs and related co-polymers, poly(2-methoxy-5(2'-ethyl)hexyloxyphenylenevinylene), poly(2,7-(9,9-di-n-octylfluorene)-(1,4-phenylene-((4-secbutylphenyl)imino)-1,4-phenylene)) (TFB), poly(2,7-(9,9-di-n-octylfluorene)-(1,4-phenylene-((4-methylphenyl)imino)-1,4-phenylene-((4 methylphenyl)imino)-1,4-phenylene)) (PFM), poly(2,7-(9,9-di-n-octylfluorene)-(1,4-phenylene-((4-methoxyphenyl)imino)-1,4-phenylene-((4-methoxyphenyl)imino)-1,4-phenylene)) (PFMO), poly(2,7-(9,9-di-n-octylfluorene) (F8) or (2,7-(9,9-di-n-octylfluorene)-3,6-Benzothiadiazole) (F8BT). Alternative materials include small molecule materials such as Alq3. Composites or blends of the such materials is also envisioned.

Some materials contemplated for use as the semiconducting or semimetallic organic layer 16 include cyano-polyphenylene vinylenes (CN-PPV) such as: poly(2,5-di(3,7-dimethyloctyloxy)-cyanoterephthalylidene); poly(5-(3,7-dimethyloctyloxy)-2-methoxy-cyanoterephthalylidene); poly(5-(2-ethylhexyloxy)-2-methoxy-cyanoterephthalylidene); poly(2,5-di(hexyloxy)cyanoterephthalylidene); or poly(2,5-di(octyloxy)cyanoterephthalylidene).

Some other materials contemplated for use as the semiconducting or semimetallic organic layer 16 include polyphenylene vinylenes (PPV) such as: poly(2-methoxy-5-(2'-ethylhexyloxy)-1,4-phenylenevinylene) MEH-PPV; poly(1-methoxy-4-(o-disperse red 1))-2,5-phenylenevinylene; poly (2-(2',5'-bis(2"-ethylhexyloxy)phenyl)-1,4-phenylenevinylene), BEHP-PPV; poly(2,5-bis(1,4,7,10-tetraoxaundecyl)-1,4-phenylenevinylene); poly(2,5-bis(3',7'-dimethyloctyloxy)-1,4-phenylenevinylene); poly(2,5-bisoctyloxy)-1,4-phenylenevinylene; poly(2,5-dihexyloxy-1,4-phenylenevinylene); or poly(2-methoxy-5-(3',7'-dimethyloctyloxy)-1,4-phenylenevinylene).

Some other materials contemplated for use as the semiconducting or semimetallic organic layer 16 include PPV Copolymers such as: poly(m-phenylenevinylene)-alt-(2,5-dibutoxy-p-phenylenevinylene); poly(m-phenylenevinylene)-ah-(2,5-dihexyloxy-p-phenylenevinylene); poly(m-phenylenevinylene)-alt-(2-methoxy-5-(2-ethylhexyloxy)-p-phenylenevinylene); poly(m-phenylenevinylene)-alt-(2-methoxy-5-octyloxyp-phenylenevinylene); poly(m-phenylenevinylene)-co-(2,5-dioctoxy-p-phenylenevinylene); poly[(o-phenylenevinylene)-alt-(2-methoxy-5-(2-ethylhexyloxy)-p-phenylenevinylene)]; poly [(p-phenylenevinylene)-alt-(2-methoxy-5-(2-ethylhexyloxy)-p-phenylenevinylene)]; or poly {[2-[2',5'-bis (2"-ethylhexyloxy)phenyl]-1,4-phenylenevinylene)]-co-[2-methoxy-5-(2'-ethylhexyloxy)-1,4-phenylenevinylene]}.

Some other materials contemplated for use as the semiconducting or semimetallic organic layer 16 include polyfluorenes (PFO, PFE) such as: poly[9,9-di-(2'-ethylhexylfluorenyl-2,7'-diyl)]; poly(9,9-di-n-hexylfluorenyl-2,7'-diyl); poly (9,9-di-n-octylfluorenyl-2,7'-diyl); poly(9,9-di-n-dodecylfluorenyl-2,7-diyl); poly(9,9-dioctylfluorenyl-2,7-yleneethynylene); poly[9,9-di(2'-ethylhexyl)fluoren-2,7-yleneethynylene]; poly[9,9-di(3',7'-dimethyloctyl)fluoren-2,7-yleneethynylene]; or poly(9,9-didodecylfluorenyl-2,7-yleneethynylene).

Some other materials contemplated for use as the semiconducting or semimetallic organic layer 16 include polythiophenes such as: poly(3-alkylthiophenes) (P3AT), poly(3-butylthiophene-2,5-diyl) (P3BT), poly(3-hexylthiophene-2,5-diyl) (P3HT), poly(3-octylthiophene-2,5-diyl) (P3OT), poly(3-decylthiophene-2,5-diyl) (P3DT), poly(3-dodecylthiophene-2,5-diyl) (PDDT).

Some other materials contemplated for use as the semiconducting or semimetallic organic layer 16 include ladder polymers (that is, double-strand polymers) such as: poly(benzobisimidazobenzophenanthroline) (BBL), ladder-type poly(p-phenylenes) (LPPP), ladder-type methyl-substituted poly(p-phenylene (MeLPPP).

Some other materials contemplated for use as the semiconducting or semimetallic organic layer 16 include co-polymers such as: poly(9,9-dioctyffluorene-co-bis-N,N'-(4-butylphenyl)-bis-N,N'-phenyl-1,4-phenylenediamine) (PFB), poly(9,9-dioctylfluorene-co-bis-N,N'-(4-methylphenyl)-bis-N,N'-phenyl-1,4-phenylenediamine) (PFM), poly(9,9-dioctyffluorene-co-bis-N,N'-(4-methoxyphenyl)-bis-N,N'-phenyl-1,4-phenylenediamine) (PFMO), poly(9,9'-dioctylfluorene-co-N-(4-butylphenyl)diphenylamine) (TFB), poly(9,9'-dioctylfluorene-co-bis-N,N'-(4-butylphenyl)-bis-N,N'-phenylbenzidine) (BFB), poly(2,7-(9,9-di-noctylfluorene-alt-benzothiadiazole) (F8BT) blended with poly(2,7-(9,9-di-n-octylfluorene)-alt-(1,4-phenylene-((4-secbutylphenyl) secbutylphenyl)imino)-1,4-phenylene)) (TFB).

Some other materials contemplated for use as the semiconducting or semimetallic organic layer 16 include poly(aryleneethynylene)s (PAEs) such as: dialkoxy-poly(p-phenyleneethynylene)s, alkoxy copolymers and acceptor-substituted poly(p-phenyleneethynylene)s, alkyl- and aryl-substituted poly(p-phenyleneethynylene)s, meta-linked poly(p-phenyleneethynylene)s, thiophenyleneethynylenes and related PAEs, organometallic PAEs.

Some other materials contemplated for use as the semiconducting or semimetallic organic layer 16 include semiconducting small molecules such as: anthracene; rubrene; 9,10 phenanthrenequinone; pentacene; 2,3-benzanthracene; triphenylene; phenanthrene; perylene; or 1,1,4,4-tetraphenyl-1,3-butadiene. Some materials contemplated for use as the semiconducting or semimetallic organic layer 16 include light-emitting metal complexes such as 8-hydroxyquinoline, aluminum salt (Alq3).

A second electrical contact 18 is disposed on the semiconducting or semimetallic organic layer 16. In some embodiments, the second electrical contact 18 comprises an aluminum layer; however, more generally any conductive layer or layers stack can be used that forms a low resistance electrical contact with the semiconducting or semimetallic organic layer 16. An example of the second electrical contact 18 as a multi-layer stack is a multi-layer stack including: a metal halide layer (for example, a lithium fluoride layer) of a few nanometers or less in thickness disposed on the semiconducting or semimetallic organic layer 16; a calcium (Ca) layer of typically 10-50 nanometers thickness disposed on the metal halide layer; and a relatively thicker aluminum layer disposed on the calcium layer. It is contemplated to have some thermally- or otherwise-induced mixing of the layers of this illustrative multi-layer electrical contact. A positive bias of the negative differential resistance (NDR) polymer device 8 is defined herein as relatively biasing the second electrical contact layer 18 more positive than the first electrical contact layer 12.

Some example actually fabricated negative differential resistance (NDR) polymer devices 8 are now described.

Indium tin oxide (ITO) coated glass substrates were used with a sheet resistance ($R_s$) below 10 $\Omega$-cm to define the support 10 and the first electrical contact layer 12 as glass and ITO, respectively. A $TiO_2$ layer was disposed atop the ITO layer 12 to define the tunneling barrier layer 14 by a two-step process. First, a thin layer of titanium metal was deposited by electron beam evaporation in a low pressure range (~$10^7$ Torr). In different actually fabricated devices, different layer thicknesses in the range 2-20 nanometers were deposited, so as to observe the dependence of NDR behavior on the thickness of the $TiO_2$ tunneling barrier layer. Next, the deposited titanium metal was oxidized using an inductively coupled plasma reactive ion etching (ICP-RIE) system with oxygen plasma at a radio frequency power of eighty watts and the substrate nominally at room temperature. The duration of the plasma oxidation varied as a function of the titanium layer thickness in order to substantially completely convert or oxidize the titanium metal layer to $TiO_2$. The $TiO_2$ layers were monitored using atomic force microscopy (AFM) and ellipsometry. AFM data indicates that the as-deposited metallic titanium layer with a grain structure converted to a smoother surface after oxygen plasma oxidation (Root mean square roughness approximately one nanometer). The refractive index of the thinner $TiO_2$ layers was about 2.2 as measured by ellipsometry, which clearly indicates the complete oxidation of the titanium films. For thicknesses greater than or about eight nanometers, the refractive index of the Ti/$TiO_2$ layer indicates an incomplete oxidation and current-voltage (I-V) characteristics also suggest the presence of metallic Ti below the $TiO_2$ along with a visual inspection of the layer transparency.

A thin film of poly[2-methoxy-5-(2'-ethyl-hexyloxy)-1,4-phenylenevinylene] (denoted herein as MEH-PPV) was then spin coated atop the $TiO_2$ layer from a 0.5% MEH-PPV solution in 80% toluene and 20% tetrahydrofuran to define the semiconducting or semimetallic organic layer 16. This solution was warmed at 60° C. for twenty-four hours. The spin-coated films were nominally twenty-five nanometers thick. The polymer tunneling devices were completed by a shadow mask evaporation at a pressure of about $10^{-6}$ Ton of an aluminum layer defining the second electrical contact layer 18. The deposited aluminum layer was about 250 nanometers thick, and was deposited directly onto the MEH-PPV. All fabrication steps were performed in an inert glove box with less than or about 1 ppm level of oxygen and water.

Electrical measurements were performed with a semiconductor characterization system (Keithley 4200, available from Keithley Instruments, Inc., Cleveland, Ohio) at room temperature under darkness. For comparison, the ITO coated glass substrates of a control device (ITO/PEDOT:PSS/MEH-PPV/Al) was covered by PEDOT:PSS (Baytron® available from Bayer Corporation) and was then annealed at 110° C. with a resulting thickness of approximately sixty nanometers.

Figure 2:
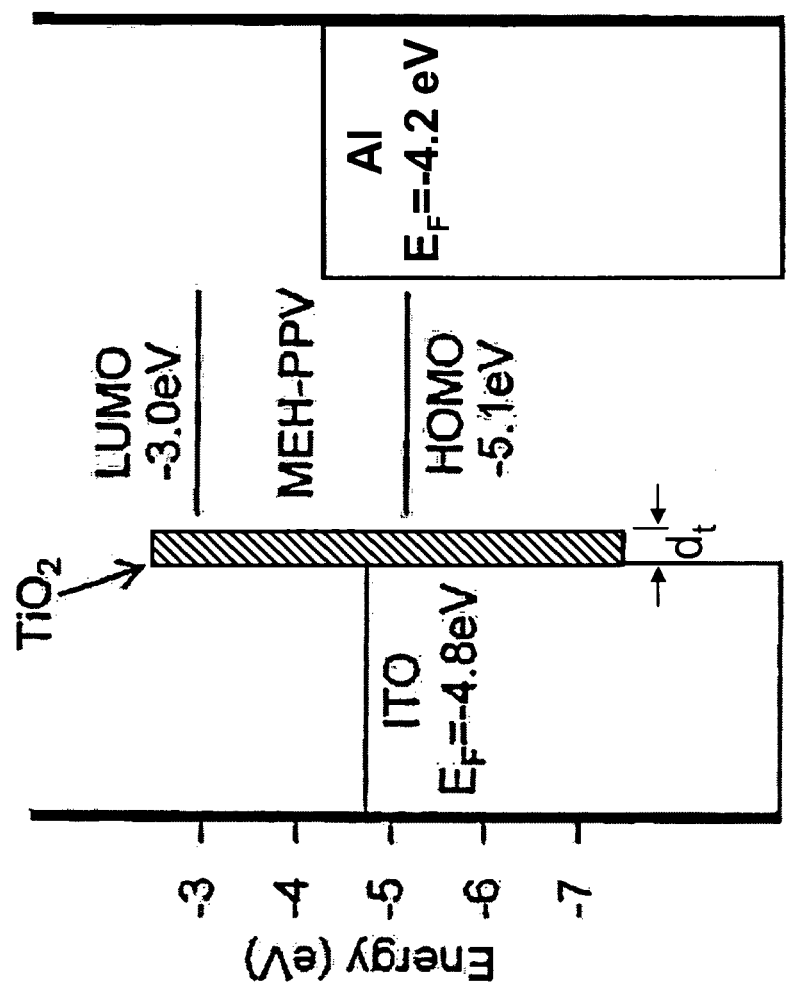
FIG. 2 depicts an estimated zero-bias band diagram for the negative differential resistance polymer device of FIG. 1.

Without being limited to any particular theory of operation, an estimated zero-bias band diagram of the example actually fabricated ITO/TiO$_2$/MEH-PPV/Al polymer tunneling diodes is shown in FIG. 2.

With reference to FIG. 3A, typical I-V characteristics of five different polymer tunneling devices each having a nominal 2 nm thick TiO$_2$ layer are shown. Large and reproducible negative differential resistance (NDR) is observed for all devices in a bias range of −10 V to 0 V. The measured peak current density for these devices was 0.13 A/cm$^2$, with a valley current density of ~0.004 A/cm$^2$, corresponding to a peak-to-valley current ratio (PVCR) of 35:1. The valley current density was generally two orders of magnitude lower than the peak current density for most measured devices (less than or about 5.0×10$^{-3}$ A/cm$^2$), which is ideally suited for low power organic-based memory. A small variation (±0.001 A/cm$^2$ in the peak current density and ±0.08 V in the peak current density position) was observed for successive sweeps. I-V characteristics for the measured devices were repeatable. After testing, the devices were stored in an inert glove box for 30 days with little variation in their peak current density and peak current position. Some device-to-device variations were observed in the peak current density (±0.004 A/cm$^2$) and in the peak current position (±0.57 V). These device-to-device variations can be attributed to small variations in the thickness ($d_t$) of TiO$_2$ layer and to small variations in the thickness of the polymer film across each sample.

With continuing reference to FIG. 3A and with further reference to FIGS. 3B, 3C, and 3D, the effect of varying the thickness of TiO$_2$ is illustrated. These FIGURES are indicative of the influence of the TiO$_2$ thickness ($d_t$) on the I-V characteristics. FIG. 3B shows I-V characteristics for a device with a four nanometer thick TiO$_2$ layer. These devices exhibit a measured maximum peak current density of 0.29 A/cm$^2$ with a PVCR of 53:1. The inset in FIG. 2B shows a forward and backward I-V sweep of the same device showing some hysteresis. A shift of about 0.6 V is observed. Some hysteresis is observed in all devices up to an eight nanometer TiO$_2$ layer, and is repeatable. As the TiO$_2$ layer thickness ($d_t$) reaches six nanometers (FIG. 3C), the peak current density decreases. The device with an eight nanometer thick TiO$_2$ layer (FIG. 3D) shows a large leakage current with a maximum peak current density of 0.23 A/cm$^2$. It was observed that the NDR behavior persists around −5 V with increasing TiO$_2$ layer thickness ($d_t$) up to eight nanometers. However, due to a large leakage current in a bias range of −10 V and 0 V, the peak current density can not be measured quantitatively for devices with thicker TiO$_2$ layers.

Without being limited to any particular theory of operation, the large leakage current in thicker barrier samples is believed to be due to a localized current pathway through the remaining metallic Ti which was not completely oxidized and converted to TiO$_2$ during the plasma oxidation process. This is believed to be merely a limitation of the particular process used for forming the TiO$_2$ layer in these particular devices—alternative deposition processes that enable thicker TiO$_2$ layers are envisioned, and devices with thicker TiO$_2$ layers are expected to provide NDR operation. Table I summarizes the I-V characteristics of the actually fabricated devices illustrating the peak current density ($J_{peak}$), peak voltage ($V_{peak}$), valley current density ($J_{valley}$), valley voltage ($V_{valley}$) and peak-to-valley current ratio (PVCR) for the devices whose I-V characteristics are shown in FIGS. 3A, 3B, 3C, and 3D.

TABLE I

| Tunneling barrier (nm) | $J_{peak}$ (A/cm$^2$) | $V_{peak}$ (V) | $J_{valley}$ (A/cm$^2$) | $V_{valley}$ (V) | PVCR (—) |
|---|---|---|---|---|---|
| 2 | −0.13 | −3.3 | −0.004 | −6.4 | 34.5 |
| 4 | −0.29 | −4.4 | −0.006 | −7.4 | 53.4 |
| 6 | −0.16 | −3.5 | −0.013 | −6.1 | 12.4 |
| 8 | −0.23 | −5.6 | −0.199 | −5.6 | 1.2 |

As a comparison, control devices were fabricated. One control device was fabricated without a TiO$_2$ layer (ITO/MEH-PPV/Al). Another control device was fabricated inserting poly(3,4-ethylenedioxythiophene) poly(styrenesulfonate) (denoted herein as PEDOT:PSS) between the ITO and MEH-PPV films (ITO/PEDOT:PSS/MEH-PPV/Al). Neither control device exhibited NDR in the bias range of −10 V and 0 V. Without being limited to any particular theory of operation, it is believed that this result for the control devices indicates that the observed NDR behavior is not induced by electron trapping in the ITO or by metal spikes at the anode/polymer interface.

Figure 4:
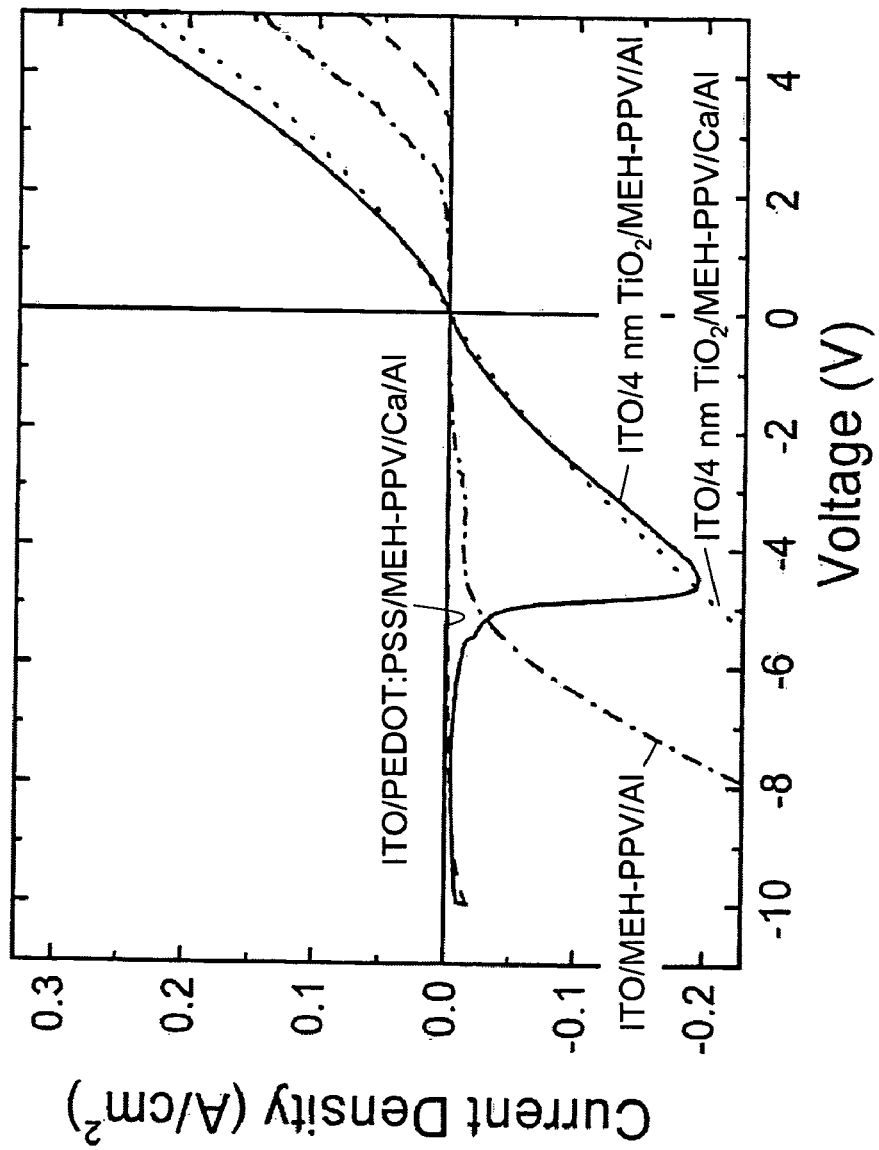
FIG. 4 plots some example I-V characteristics measured for different device structures: ITO/TiO$_2$ (4 nm)/MEH-PPV/Al (solid line); ITO/TiO$_2$ (4 nm)/MEH-PPV/Ca/Al (dotted line); ITO/MEH-PPV/Al (dot-dashed line); and ITO/PEDOT:PSS/MEH-PPV/Ca/Al (dashed line).

With reference to FIG. 4, some example I-V characteristics measured for different devices are plotted. In FIG. 4, the solid line plots an I-V characteristic measured for a ITO/TiO$_2$ (4 nm)/MEH-PPV/Al structure. A clear NDR region is observed. The dotted line plots an I-V characteristic measured for a ITO/TiO$_2$ (4 nm)/MEH-PPV/Ca/Al structure. The dot-dashed line plots an I-V characteristic measured for a ITO/MEH-PPV/Al structure. The dashed line plots an I-V characteristic measured for a ITO/PEDOT:PSS/MEH-PPV/Ca/Al structure.

Figure 5:
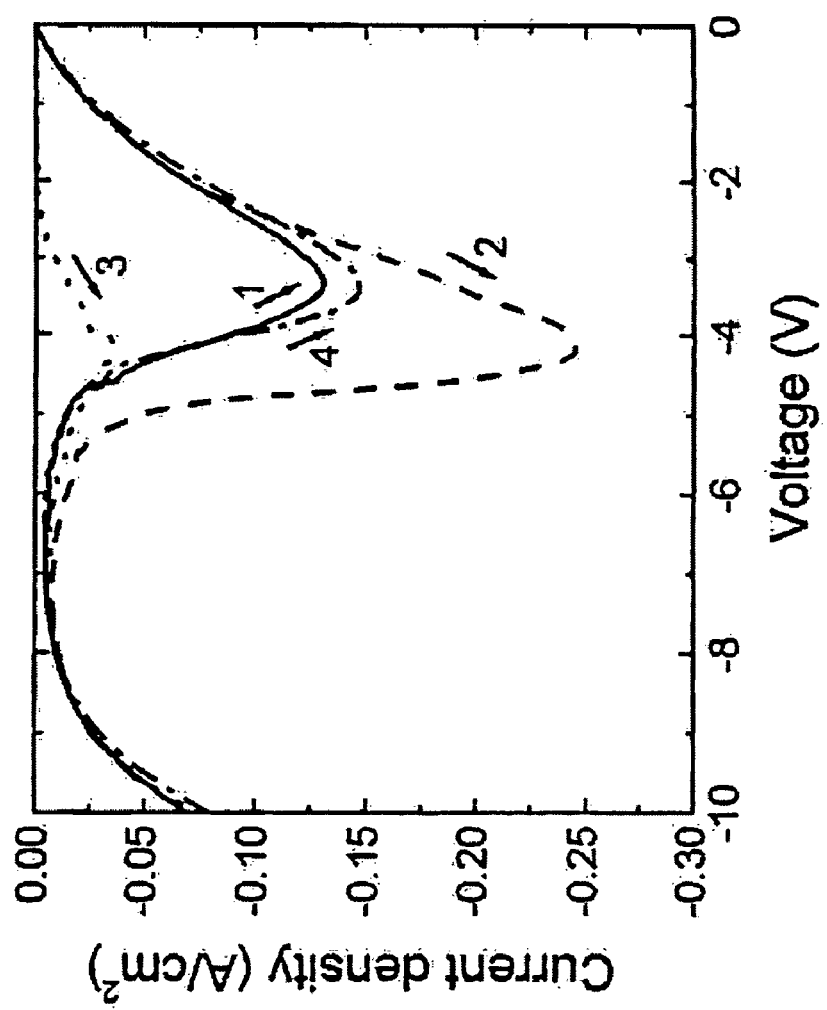
FIG. 5 plots changes in the I-V characteristic observed for successive voltage sweeps in different directions.

With reference to FIG. 5, changes in the NDR were observed for voltage sweeps in different directions. In a first forward voltage sweep shown in FIG. 5 (solid line labeled "1" with a forward arrow), the position of the peak current and valley current are in good agreement with the previous I-V curves. When a second voltage sweep (dashed line labeled "2" with a backward arrow) was applied in the reverse direction, the I-V curve showed some hysteresis, as shown in the inset of FIG. 3B. A following third reverse voltage sweep (dotted line labeled "3" with a backward arrow in FIG. 5) produced a decreased peak current by one order of magnitude. Then, the initial peak current reappeared during a fourth voltage sweep in a positive direction (dot-dashed line labeled "4" with a forward arrow in FIG. 5).

Without being limited to any particular theory of operation, it is suspected that this switching effect may be due to different conduction pathways through the disordered polymer regions over the TiO$_2$ surface or charging and charge removal in traps within the TiO$_2$ layer. The observed reverse-biased NDR behavior does not seem to occur via tunneling across the thin TiO$_2$ layer acting as a traditional tunneling barrier based upon the measured I-V characteristics and observed switching effects. This is evidenced in the peak current density of Table I through the lack of an exponential decrease in peak current density with increasing TiO$_2$ layer thickness.

With reference back to FIG. 2, and again without being limited to any particular theory of operation, it is believed that the NDR behavior observed occurs as a result of tunneling through localized defect sites within the thin TiO$_2$ layers induced during the plasma oxidation that are confined to a small range of energies within the bandgap near the TiO$_2$ conduction band. The mechanism for NDR under reverse bias in these ITO/TiO$_2$/MEH-PPV/Al polymer-based devices is believed to occur via electrons emitted from the n-type ITO, tunneling through defect states in the TiO$_2$, which are then collected by the lowest unoccupied molecular orbital (LUMO) level in the MEH-PPV. This is further supported by a diminished NDR that was observed in a control sample in which the TiO$_2$ layer was plasma-oxidized at about 400° C., which is known to lead to better crystallinity and therefore provides fewer defect states available for tunneling.

Figure 6:
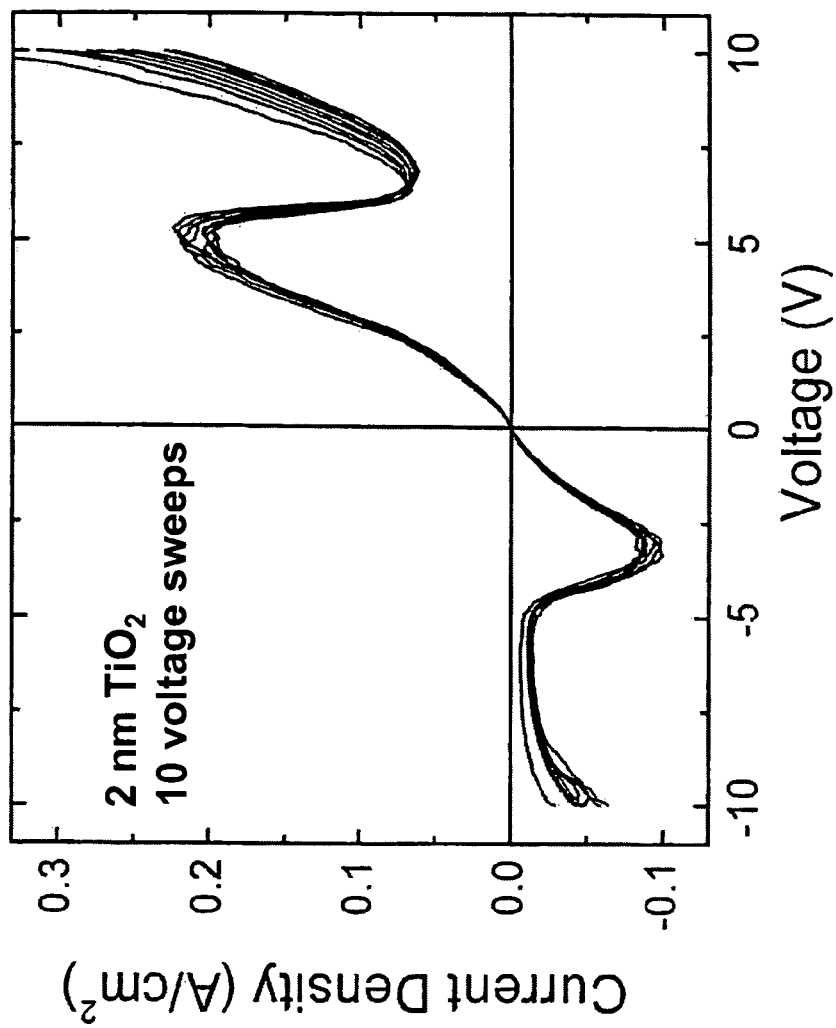
FIG. 6 plots the I-V characteristic measured for ten −10 V-to-+10 V voltage sweeps applied to a ITO/TiO$_2$ (2 nm)/MEH-PPV/Al structure.

With reference to FIG. 6, in a positive bias range 0 V to +10 V, NDR behavior was also observed in some devices. For example, FIG. 6 shows negative differential resistance in a region of about +5 V to +6 V for a negative differential resistance polymer diode having a two nanometer thick TiO$_2$ tunneling barrier layer. The peak and valley current varied from one I-V measurement to the next, but by the same order of magnitude for the same device. The position of the peak and valley voltage also varied between I-V measurements. Correspondingly, a rapid current drop to nearly zero at about 6 V was also sometimes observed.

Figure 7:
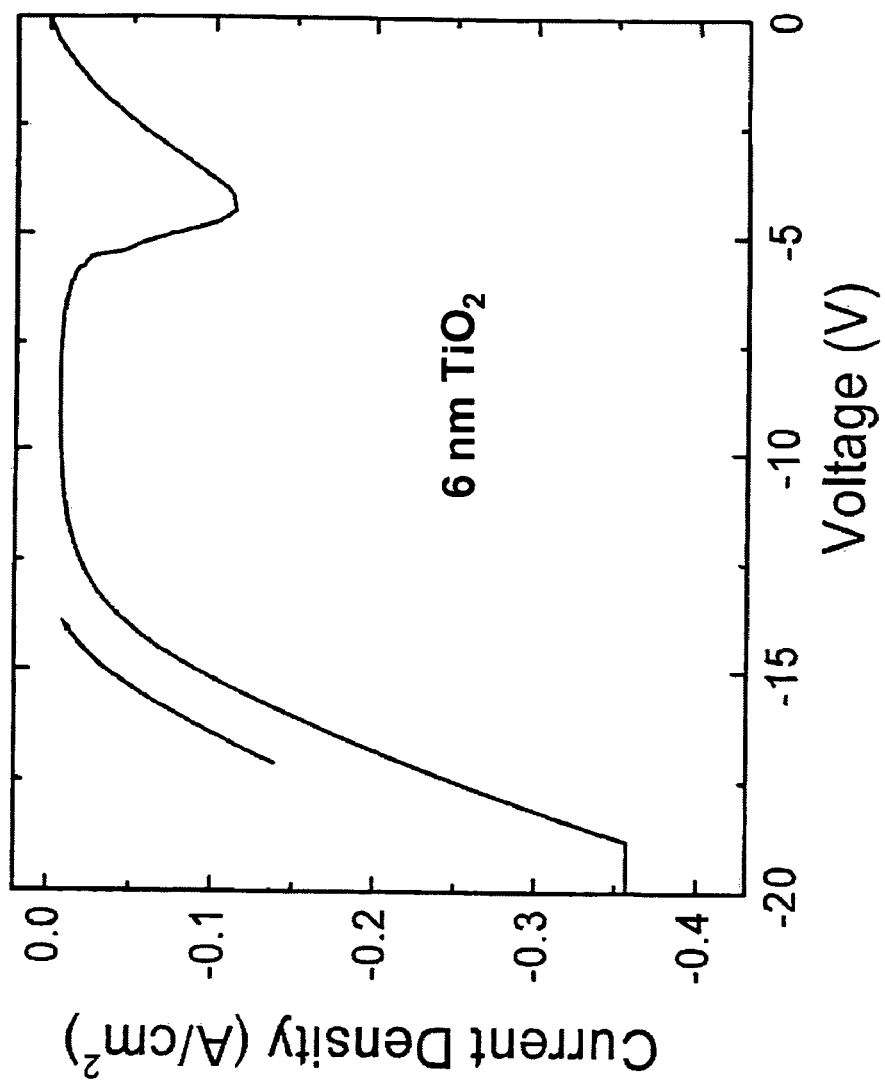
FIG. 7 plots the I-V characteristic measured for a −20 V to 0 V sweep for a negative differential resistance polymer diode having a six nanometer thick TiO$_2$ tunneling barrier layer.

With reference to FIG. 7, a –20 V to 0 V sweep is shown for a negative differential resistance polymer diode having a six nanometer thick TiO$_2$ tunneling barrier layer. A NDR region is again observed.

Figure 8:
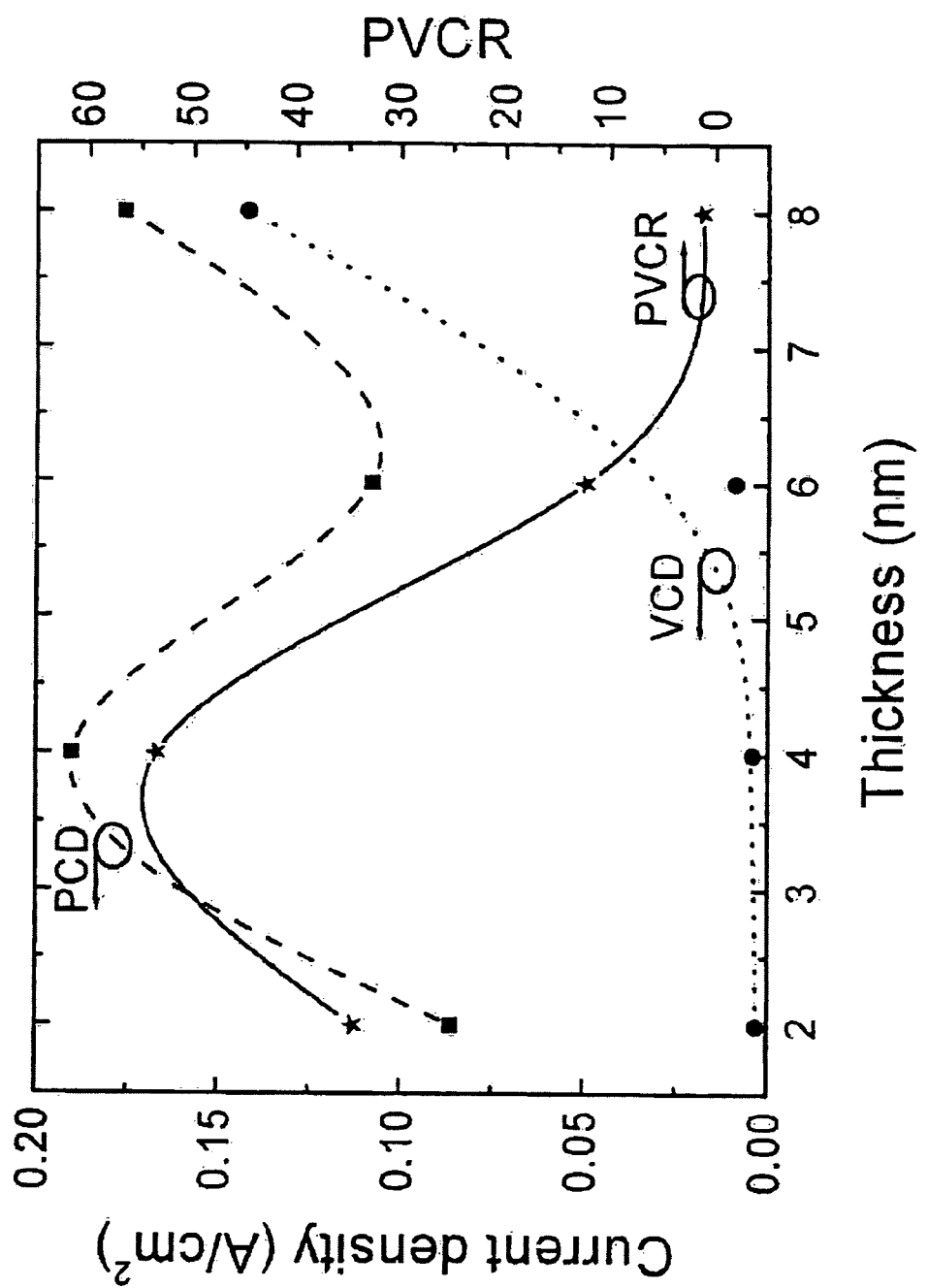
FIG. 8 plots measured peak current density (PCD; solid square points), valley current density (VCD; solid circle points), and peak-to-valley current ratio (PVCR; solid star points) for the negative differential resistance polymer diodes having TiO$_2$ tunneling barrier thicknesses values indicated in the abscissa. The left-hand ordinate scale is the current density scale, while the right-hand ordinate scale is the PVCR scale. The dashed line is an empirical fit to the peak current density data; the dotted line is an empirical fit to the valley current density data; and the solid line is an empirical fit to the PVCR data.

With reference to FIG. 8, the measured peak current density (PCD; solid square points) and valley current density (VCD; solid circle points) are plotted for several negative differential resistance polymer diodes having TiO$_2$ tunneling barrier thicknesses ($d_t$) values indicated in the abscissa of FIG. 8. The left-hand ordinate scale is the current density scale. The dashed line is an empirical fit to the peak current density data, while the dotted line is an empirical fit to the valley current density data. Also plotted in FIG. 8 is the peak-to-valley current ratio (PVCR; solid star points) for the negative differential resistance polymer diodes having TiO$_2$ tunneling barrier thicknesses ($d_t$) values indicated in the abscissa of FIG. 8. The right-hand ordinate scale is the PVCR scale. The solid line is an empirical fit to the PVCR data.

Figure 9B:
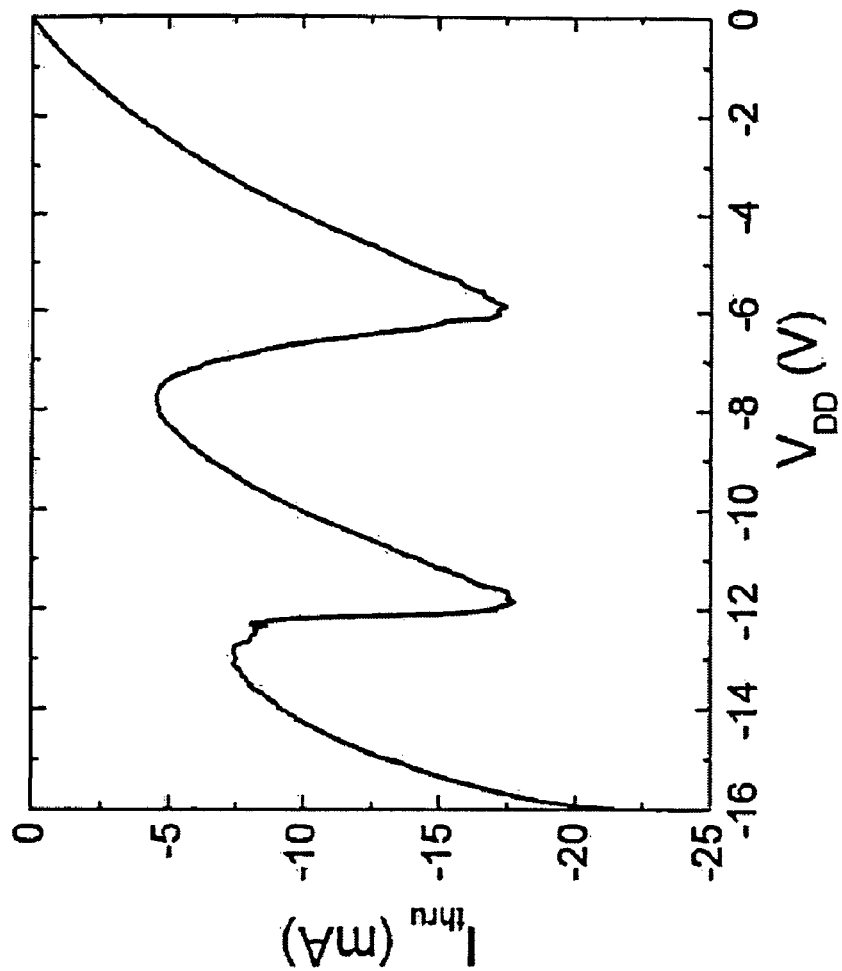
FIG. 9B shows a measured I-V characteristic for a device of FIG. 9A in which the negative differential resistance polymer diodes 8 each include a two nanometer thick $TiO_2$ layer.
Figure 9A:
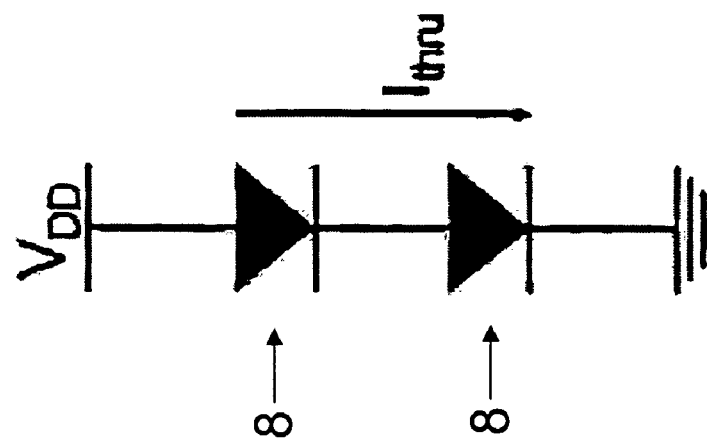
FIG. 9A shows an electrical schematic of two negative differential resistance polymer diodes 8 connected in series between an applied voltage $V_{DD}$ and a ground.

With reference to FIGS. 9A and 9B, to demonstrate useable quantum functional circuit operation using the negative differential resistance polymer diode 8, a monostable-bistable transition logic element (MOBILE) latch was constructed. FIG. 9A shows an electrical schematic of two negative differential resistance polymer diodes 8 connected in series between an applied voltage $V_{DD}$ and a ground, such that a current $I_{thru}$ flows through the two series-connected negative differential resistance polymer diodes 8. FIG. 9B shows the operation of the device of FIG. 9A responsive to sweeping of the voltage $V_{DD}$ between –16 V and 0 V, for a device in which the negative differential resistance polymer diodes 8 each include a two nanometer thick TiO$_2$ layer.

Figure 10B:
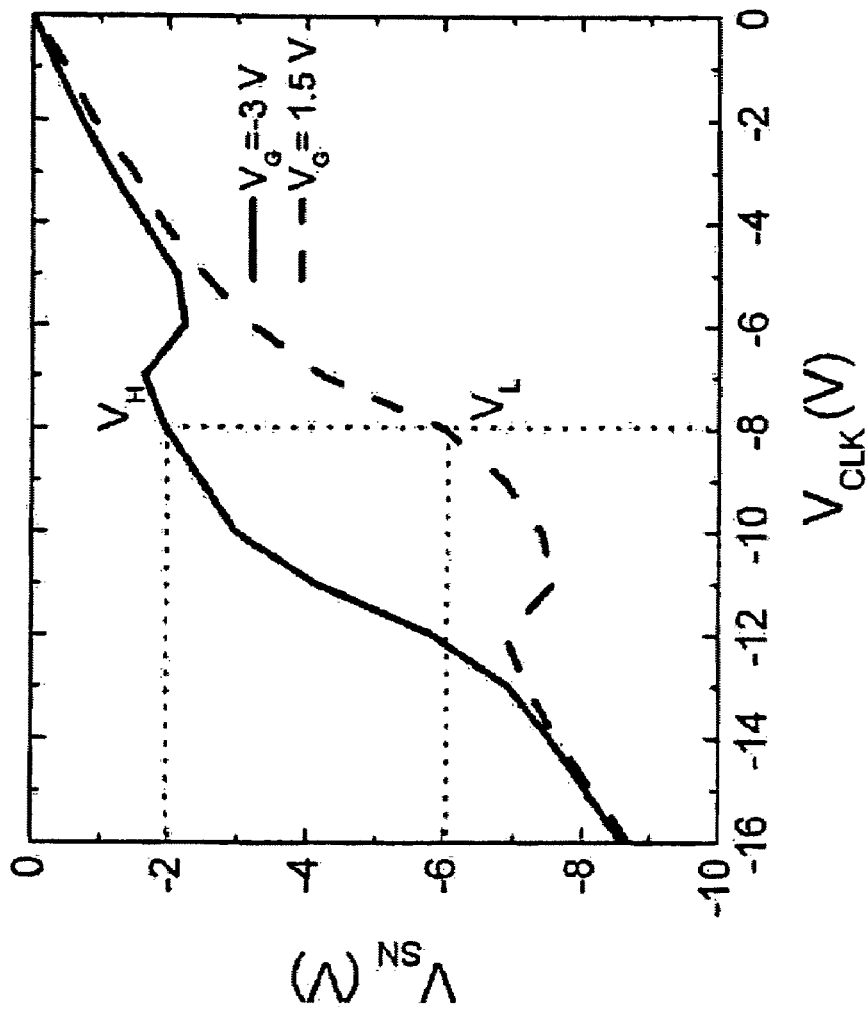
FIG. 10B shows a measured I-V characteristic for a MOBILE latch constructed in conformance with the electrical schematic of FIG. 10A.
Figure 10A:
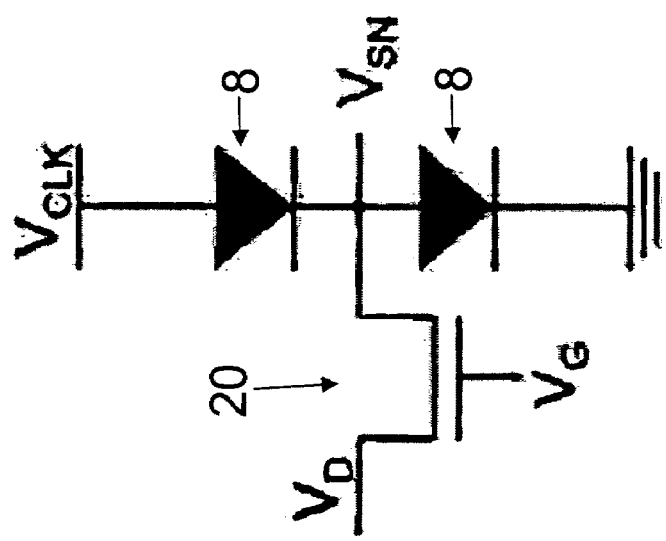
FIG. 10A shows an electrical schematic of a monostable-bistable transition logic element (MOBILE) latch constructed by incorporating a junction field effect transistor (JFET) connected to the central storage node of the serially connected negative differential resistance polymer diodes of the device of FIG. 9A.

With reference to FIGS. 10A and 10B, a MOBILE logic function device can be realized by modifying the device of FIG. 9A by incorporating a transistor 20, such as a commercial junction field effect transistor (JFET), a polymer field effect transistor (PFET), organic field effect transistor (OFET), or other field effect transistor (FET), or another type of transistor, so forth. In the topology shown in FIG. 10A, the transistor 20 is a FET connected to the central storage node of the pair of serially connected negative differential resistance polymer diodes 8. In actually constructed devices having the topology of FIG. 10A, latching was achieved. In these actually constructed devices, charging or discharging was provided by a commercial JFET input current. With a JFET gate bias ($V_G$) of 1.5 V and drain-to-source bias ($V_D$) of 1 V, the input current was 20 mA. For an applied clock voltage ($V_{CLK}$) the output voltage at the sense node ($V_{SN}$) was measured when the JFET was in the off state (i.e., $V_G$=–3 V) and on-state (i.e., $V_G$=1.5 V) as shown in FIG. 10B. The MOBILE circuit of FIG. 10A forms two stable latching points at the sense node $V_{SN}$, demonstrating bistable latching operation. For an applied $V_{CLK}$ of –8 V, the voltages of the logic high ($V_H$) and low ($V_L$) are –1.95 V and –6.01 V, respectively. The percentage of voltage swing, which is ratio between $V_H$ and $V_L$ for applied $V_{CLK}$, was 51%. Thus, stable latching and quantum functional circuit operation has been demonstrated.

The illustrated MOBILE latch is an example. More generally, a latch or memory device can be constructed by operatively coupling at least one negative differential resistance polymer diode 8 with at least one additional electrical element operatively coupled with the negative differential resistance polymer diode to define a latching or memory element having at least two stable states. In one design approach, the at least one additional electrical element includes a transistor, resistor, or so forth that defines a load line having an I-V characteristic that intersects the I-V characteristic of the at least one negative differential resistance polymer diode 8 at two or more points to define two or more stable states for the latch or memory device. One suitable load is a PFET or OFET such as are described, for example, in Xu et al., J. Appl. Phys. vol. 95 pages 1497-1501 (2004) which is incorporated by reference herein in its entirety, and in references therein. Using a PFET or OFET load advantageously facilitates fabricating a compact and substantially monolithic latch on a flexible substrate.

Figure 11:
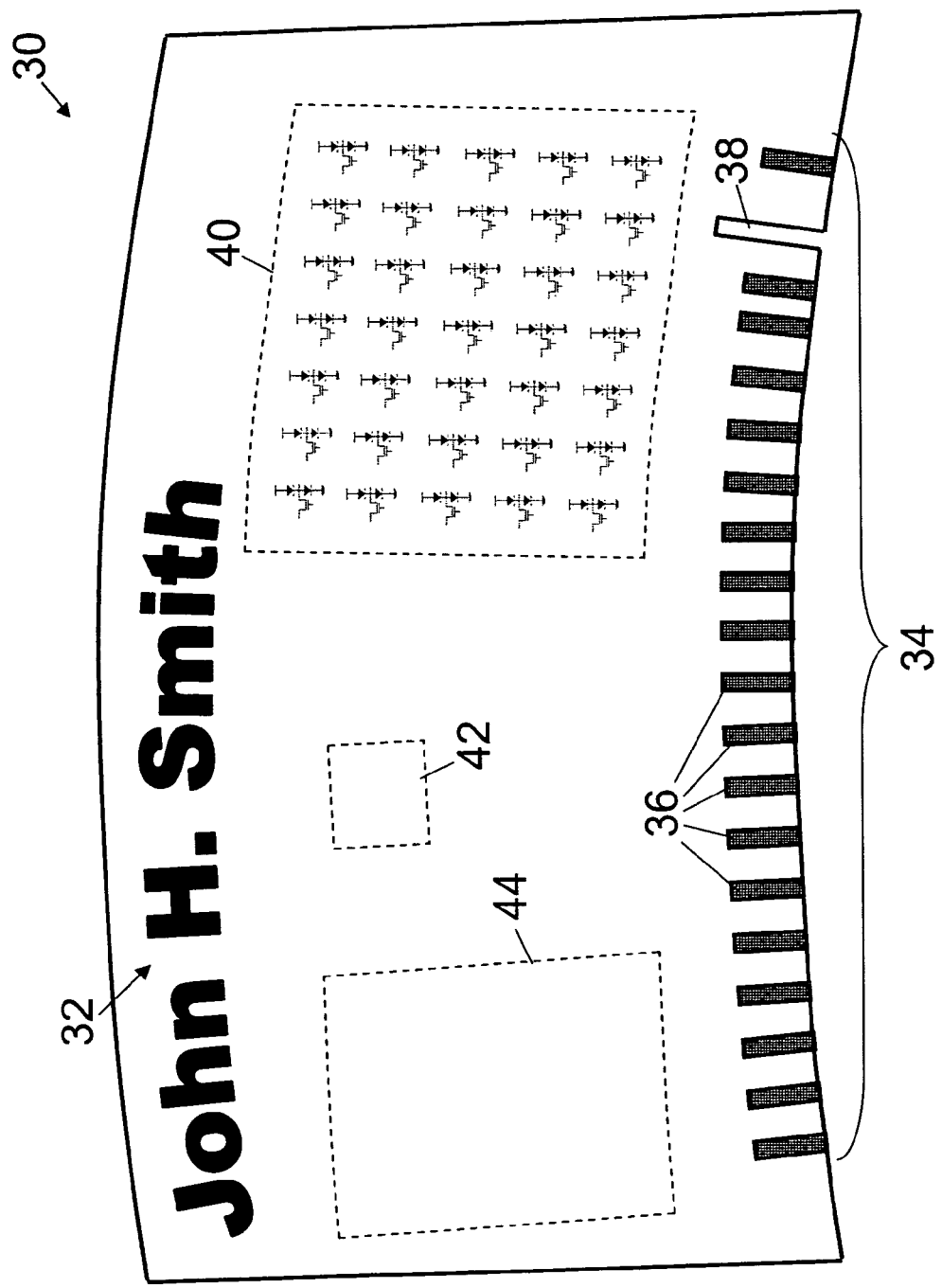
FIG. 11 shows a perspective view of a smart card employing an array of latches each having the topology shown in FIG. 10A.

With reference to FIG. 11, an example "smart card" device 30 is shown, which is suitable for carrying medical information or other personal data. The example card 30 is for "John H. Smith" as indicated by the printed, typed, or otherwise visible label 32. The example card 30 is a relatively flexible card, as indicated by the bowing of the card 30 depicted in FIG. 11. The example card 30 includes an edge connector 34 having contact fingers 36 of gold strips or the like and a keying slot 38. The edge connector 34 is adapted to be inserted edge-on into a card interface device (not shown) to enable reading or writing of information to the card 30. Alternatively, a magnetic strip, RFID-type wireless link, or other wired or wireless communication configuration can be used. The data is stored in an array 40 of latches each including one or more negative differential resistance polymer diode 8. In FIG. 11, the array 40 of MOBILE latches of the type shown in FIG. 10A are diagrammatically represented by a 7×5 array of MOBILE latch schematics—however, it is to be appreciated that the array 40 of latches is contemplated to include thousands, tens of thousands, millions, or more latches, each addressable using suitable address lines (not shown) to store data to and read data from selected latches. Such large arrays occupy substantial real estate on the card 30; however, because the polymer-based latches are flexible, the card 30 remains substantially flexible.

The card 30 further includes a suitably configured logic circuitry unit or processor 42 configured or programmed to receive data from the edge connector 34 and store such data in the latches array 40, to read data from the latches array 40 and output it via the edge connector 34, or so forth. Thus, the latches array 40 and the logic circuitry 42 together define a data memory. In some contemplated embodiments, the processor 42 comprises circuitry constructed primarily of interconnected PFETs or OFETs formed on the flexible plastic substrate of the card 30. In other contemplated embodiments, the processor 42 is a conventional silicon processor chip that is of sufficiently small area so as to not substantially restrict the flexibility of the card 30. In this regard, it will be appreciated that the area of a silicon LSI or VLSI processor is typically substantially smaller than the area of the latches array 40. The silicon chip is suitably attached using a low profile surface mounting technique such as flip chip bonding. The smart card 30 also includes a suitable flexible power source, such as a generally planar lithium battery 44, and optionally includes other features not shown in FIG. 11, such as a fingerprint reader to provide identity protection.

Figure 12:
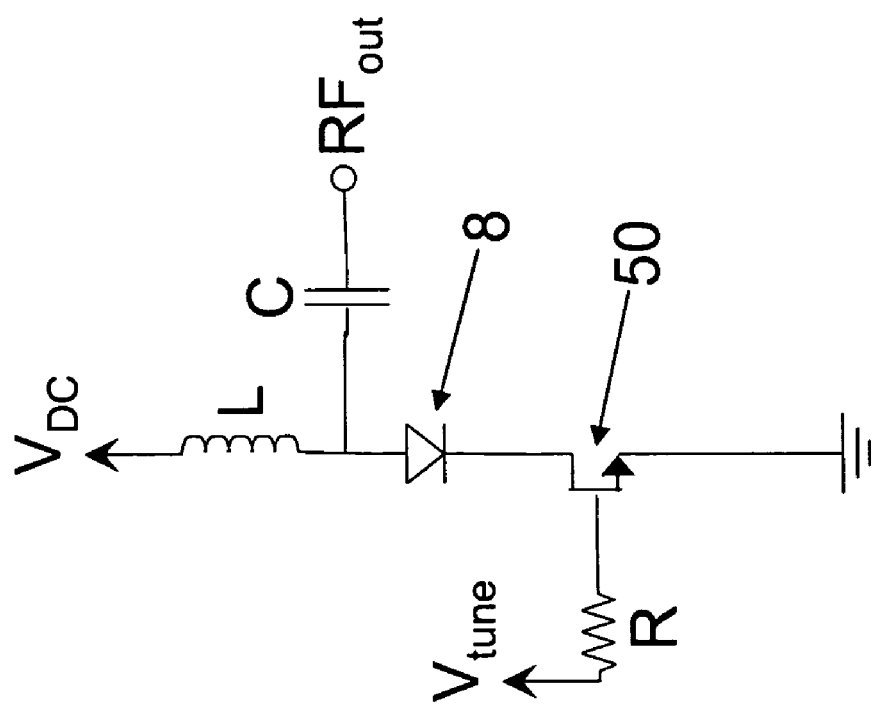
FIG. 12 shows an electrical schematic of a mixed signal circuit employing the negative differential resistance polymer diode of FIG. 1.

With reference to FIG. 12, another application of the negative differential resistance polymer diode 8 is in mixed signal circuits. FIG. 12 shows a voltage-controlled oscillator (VCO) employing the negative differential resistance polymer diode 8, a transistor 50 such as a PFET, OFET, or so forth, biased by a d.c. bias $V_{DD}$ via an inductor L. A capacitor C provides high-pass filtering for an output denoted $RF_{out}$ in FIG. 12. The oscillation frequency of the VCO is controlled by a tuning voltage $V_{tune}$ fed to the transistor 50 via a resistor R. The circuit topology of the VCO shown in FIG. 12 is disclosed in Cidronali et al., Ultralow DC Power VCO Based on InP-HEMT and Heterojunction Interband Tunnel Diode for Wireless Applications, IEEE Transactions on Microwave Theory and Techniques, vol. 50 pp. 2938-46 (2002) which is incorporated by reference herein in its entirety. However, the VCO of that reference is different from the VCO circuit of FIG. 12 at least in that the silicon-based heterojunction interband tunnel diode of that reference is replaced by the negative differential resistance polymer diode 8 to provide the negative differential resistance element. Additionally, the silicon-based HEMT of the VCO of the Cidronali reference is optionally replaced by a PFET, OFET, or other transistor having enhanced material similarity with the negative differential resistance polymer diode 8. For example, the negative differential resistance polymer diode 8 and the PFET or OFET transistor 50 can be formed monolithically on a flexible or rigid substrate.

The circuit of FIG. 12 can be used in various ways. If the voltage $V_{tune}$ is adjustable, then the circuit can provide voltage-controlled oscillation capability. If the voltage $V_{tune}$ is fixed or adjustable over only a small "trim" range, then the circuit can serve as a fixed-frequency oscillator. The mixed signal circuit of FIG. 12 is an example—other mixed signal circuits can be constructed using the negative differential resistance polymer diode 8 or variants thereof as negative differential resistance elements supporting radio frequency oscillation in the kilohertz range, megahertz range, or higher frequency range. For example, a mixed signal receiver circuit can be constructed to receive and demodulate or digitize a radio frequency signal generated using the circuit of FIG. 12. A suitable receiver or analog-to-digital converter can be built, for example, using circuit topologies disclosed in Broekaert et al., A Monolithic 4-Bit 2-Gsps Resonant Tunneling Analog-to-Digital Converter, IEEE Journal of Solid-State Circuits, vol. 33, pp. 1342-49 (1998), which is incorporated by reference herein in its entirety, by replacing the resonant tunneling diodes of those circuits by the resistance polymer diode 8 or a variant thereof, and by optionally further replacing the transistors of those circuits by PFET or OFET devices.

With reference back to FIG. 1, the actually fabricated example ITO/TiO$_2$/MEH-PPV/Al devices were made by depositing the TiO$_2$ tunneling barrier layer 14 first, followed by deposition of the MEH-PPV semiconducting or semimetallic organic layer 16. This approach has the advantage of allowing aggressive processing to be applied in the manufacture of the tunneling barrier layer 14, such as the example oxidization of the deposited titanium using ICP-RIE with oxygen plasma at a radio frequency power of eighty watts. On the other hand, if the semiconducting or semimetallic organic layer 16 is formed first, it may be damaged by such aggressive processing. However, it is also contemplated to reverse the manufacturing sequence by first depositing or otherwise forming the semiconducting or semimetallic organic layer 16 followed by deposition or other formation of the tunneling barrier layer 14. In this latter sequence, the formation of the tunneling barrier 14 should employ processing that does not unduly damage the semiconducting or semimetallic organic layer 16.

One contemplated processing for forming the TiO$_2$ or other tunneling barrier layer on a previously formed semiconducting or semimetallic organic layer is modified atomic layer epitaxy (ALE) using precursors that undergo pyrolysis at reduced substrate temperatures. For an oxide tunneling barrier layer, the modified ALE is optionally assisted by an oxygen plasma source to enhance oxygen incorporation to promote formation of stoichiometric TiO$_2$ or other oxide material. In other contemplated approaches, cold temperature processing such as wafer bonding or lamination techniques can be used to form the TiO$_2$ or other tunneling barrier layer on a previously formed semiconducting or semimetallic organic layer.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The appended claims follow:

The invention claimed is:

1. A device comprising:
   a first electrical contact;
   a second electrical contact;
   a semiconducting or semimetallic organic layer disposed at least partially between the first and second electrical contacts; and
      a tunneling barrier layer disposed at least partially between the semiconducting or semimetallic organic layer and the first electrical contact, the tunneling barrier layer having a thickness effective to enable flow of an electrical current through the tunneling barrier layer responsive to an operative electrical bias applied across the first and second electrical contacts, the electrical current exhibiting negative differential resistance for at least some applied electrical bias values;
   wherein the first electrical contact, the second electrical contact, the semiconducting or semimetallic organic layer, and the tunneling barrier layer define a negative differential resistance polymer diode.

2. The device as set forth in claim 1, further comprising:
   a flexible substantially planar support on which are disposed the first and second electrical contacts, the semiconducting or semimetallic organic layer, and the tunneling barrier layer.

3. The device as set forth in claim 1, wherein the tunneling barrier layer comprises a metal oxide layer.

4. The device as set forth in claim 3, wherein the metal oxide tunneling barrier layer consists essentially of TiO$_2$.

5. The device as set forth in claim 4, wherein the semiconducting or semimetallic organic layer comprises a polyphenylene vinylene (PPV) or PPV derivative material.

6. The device as set forth in claim 3, wherein the semiconducting or semimetallic organic layer comprises a polyphenylene vinylene (PPV) or PPV derivative material.

7. The device as set forth in claim 1, wherein the semiconducting or semimetallic organic layer comprises a polymer material.

8. The device as set forth in claim 1, wherein the semiconducting or semimetallic organic layer comprises a small molecule material.

9. The device as set forth in claim 1, wherein the tunneling barrier layer comprises an oxidized titanium layer.

10. The device as set forth in claim 9, wherein the first electrical contact comprises an indium tin oxide (ITO) layer, and the oxidized titanium tunneling barrier layer contacts the ITO layer.

11. The device as set forth in claim 1, wherein the semiconducting or semimetallic organic layer comprises a polyphenylene vinylene (PPV) or PPV derivative material.

12. The device as set forth in claim 1, wherein the tunneling barrier layer has a thickness of less than 30 nanometers.

13. The device as set forth in claim 1, wherein the tunneling barrier layer has a thickness of less than 10 nanometers.

14. A device comprising first and second negative differential resistance polymer diodes electrically connected in series to define a latching or memory element having at least two stable states, each negative differential resistance polymer diode including:
a first electrical contact;
a second electrical contact;
a semiconducting or semimetallic organic layer disposed at least partially between the first and second electrical contacts; and
a tunneling barrier layer disposed at least partially between the semiconducting or semimetallic organic layer and the first electrical contact, the tunneling barrier layer having a thickness effective to enable flow of an electrical current through the tunneling barrier layer responsive to an operative electrical bias applied across the first and second electrical contacts, the electrical current exhibiting negative differential resistance for at least some applied electrical bias values.

15. The device as set forth in claim 14, wherein the latching or memory element further comprises at least one of a transistor, and a resistor.

16. The device as set forth in claim 14, further comprising:
an array of said latching or memory elements each having at least two stable states; and
logic circuitry operatively coupled with the array to define a data memory.

17. The device as set forth in claim 16, wherein the array and logic circuitry are disposed on a flexible card.

18. A device comprising:
a first electrical contact, a second electrical contact, a semiconducting or semimetallic organic layer disposed at least partially between the first and second electrical contacts, and a tunneling barrier layer disposed at least partially between the semiconducting or semimetallic organic layer and the first electrical contact, the tunneling barrier layer having a thickness effective to enable flow of an electrical current through the tunneling barrier layer responsive to an operative electrical bias applied across the first and second electrical contacts, the electrical current exhibiting negative differential resistance for at least some applied electrical bias values, wherein the first electrical contact, the second electrical contact, the semiconducting or semimetallic organic layer, and the tunneling barrier layer define a negative differential resistance polymer diode; and
additional circuit elements interconnected with the negative differential resistance polymer diode to define a mixed signal circuit.

19. The device as set forth in claim 18, wherein the mixed signal circuit comprises an oscillator configured to generate a radio frequency output.

20. The device as set forth in claim 1, wherein the tunneling barrier layer comprises a material selected from a group consisting of: a metal oxide, a Langmuir-Blodgett film, a self assembled monolayer (SAM), and a wide bandgap semiconductor.

21. The device as set forth in claim 20, wherein the semiconducting or semimetallic organic layer comprises a material selected from a group consisting of: a cyano-polyphenylene vinylene (CN-PPV), a polyphenylene vinylene (PPV), a PPV copolymer, a polyfluorene (PFO, PFE), a polythiophene, a ladder-type polymer, a co-polymer, a poly(aryleneethynylene), a semiconducting small molecule, and a light emitting metal complex.

22. The device as set forth in claim 20, wherein the semiconducting or semimetallic organic layer comprises polyphenylene vinylene (PPV) or PPV derivative material.

23. The device as set forth in claim 1, wherein the tunneling barrier layer has localized defect sites within the bandgap, the tunneling barrier layer having a thickness effective to enable flow of electrical current through the tunneling barrier layer through the localized defect sites within the bandgap of the tunneling barrier layer responsive to an operative electrical bias applied across the first and second electrical contacts, the electrical current exhibiting negative differential resistance for at least some applied electrical bias values.

24. The device as set forth in claim 23, wherein the localized defect sites within the bandgap of the tunneling barrier layer comprise localized defect sites near the conduction band of the tunneling barrier layer.

25. The device as set forth in claim 23, wherein the tunneling barrier layer comprises $TiO_2$.

* * * * *